United States Patent
Saito

(10) Patent No.: US 8,932,946 B2
(45) Date of Patent: Jan. 13, 2015

(54) POWER SEMICONDUCTOR DEVICE

(71) Applicant: Kabushiki Kaisha Toshiba, Tokyo (JP)

(72) Inventor: Wataru Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/183,765

(22) Filed: Feb. 19, 2014

(65) Prior Publication Data

US 2014/0167838 A1 Jun. 19, 2014

Related U.S. Application Data

(62) Division of application No. 13/787,726, filed on Mar. 6, 2013, now Pat. No. 8,686,495.

(30) Foreign Application Priority Data

Sep. 12, 2012 (JP) ................... 2012-200540

(51) Int. Cl.
  H01L 29/788 (2006.01)
  H03K 3/012 (2006.01)
  H01L 27/088 (2006.01)
  H03K 3/013 (2006.01)

(52) U.S. Cl.
  CPC .............. *H03K 3/012* (2013.01); *H01L 27/088* (2013.01); *H01L 29/788* (2013.01); *H03K 3/013* (2013.01)
  USPC ........................................................ 438/585

(58) Field of Classification Search
  CPC ........................... H01L 29/788; H01L 27/088
  USPC .......... 438/294–295, 585; 257/330–331, 259, 257/500, 502, 510
  See application file for complete search history.

(56) References Cited

U.S. PATENT DOCUMENTS

| 5,757,081 | A | 5/1998 | Chang et al. |
| 5,767,578 | A | 6/1998 | Chang et al. |
| 6,452,230 | B1 | 9/2002 | Boden, Jr. |
| 6,501,129 | B2 | 12/2002 | Osawa |
| 6,528,896 | B2 * | 3/2003 | Song et al. ..................... 257/327 |
| 6,849,880 | B1 | 2/2005 | Saito et al. |
| 6,977,425 | B2 | 12/2005 | Yoshida et al. |
| 7,074,662 | B2 * | 7/2006 | Lee et al. ...................... 438/199 |
| 7,138,319 | B2 * | 11/2006 | Chen et al. .................... 438/294 |
| 7,189,617 | B2 * | 3/2007 | Slesazeck et al. ............ 438/259 |
| 7,531,871 | B2 | 5/2009 | Omura et al. |

(Continued)

FOREIGN PATENT DOCUMENTS

| JP | 2001111050 | 4/2001 |
| JP | 2010192691 | 9/2010 |

*Primary Examiner* — Nathan Ha
(74) *Attorney, Agent, or Firm* — Patterson & Sheridan LLP

(57) ABSTRACT

According to one or more embodiments of the present invention, a method for driving a power semiconductor device that has a source electrode, a drain electrode, a semiconductor layer formed between the source electrode and the drain electrode, a plurality of gate electrodes formed within the semiconductor layer, and a plurality of conductive layers that are formed between the gate electrodes and the drain electrode and in electrical communication with the gate electrodes. The method comprises providing a first electric potential to the source electrode, providing a second electric potential to the drain electrode, providing a third electric potential to the gate electrodes, providing a first electric potential to at least one of the conductive layers, and providing a third electric potential to at least another one of the conductive layers.

12 Claims, 5 Drawing Sheets

(56) References Cited

U.S. PATENT DOCUMENTS

| | | | |
|---|---|---|---|
| 7,569,879 B2 | 8/2009 | Kinoshita et al. |
| 7,763,924 B2 | 7/2010 | Huang |
| 7,879,686 B2 | 2/2011 | Blank |
| 7,893,488 B2 | 2/2011 | Hebert |
| 2004/0056306 A1 | 3/2004 | Saito et al. |
| 2005/0167742 A1 | 8/2005 | Challa et al. |
| 2008/0087949 A1 | 4/2008 | Maruoka et al. |
| 2008/0135930 A1 | 6/2008 | Saito |

* cited by examiner

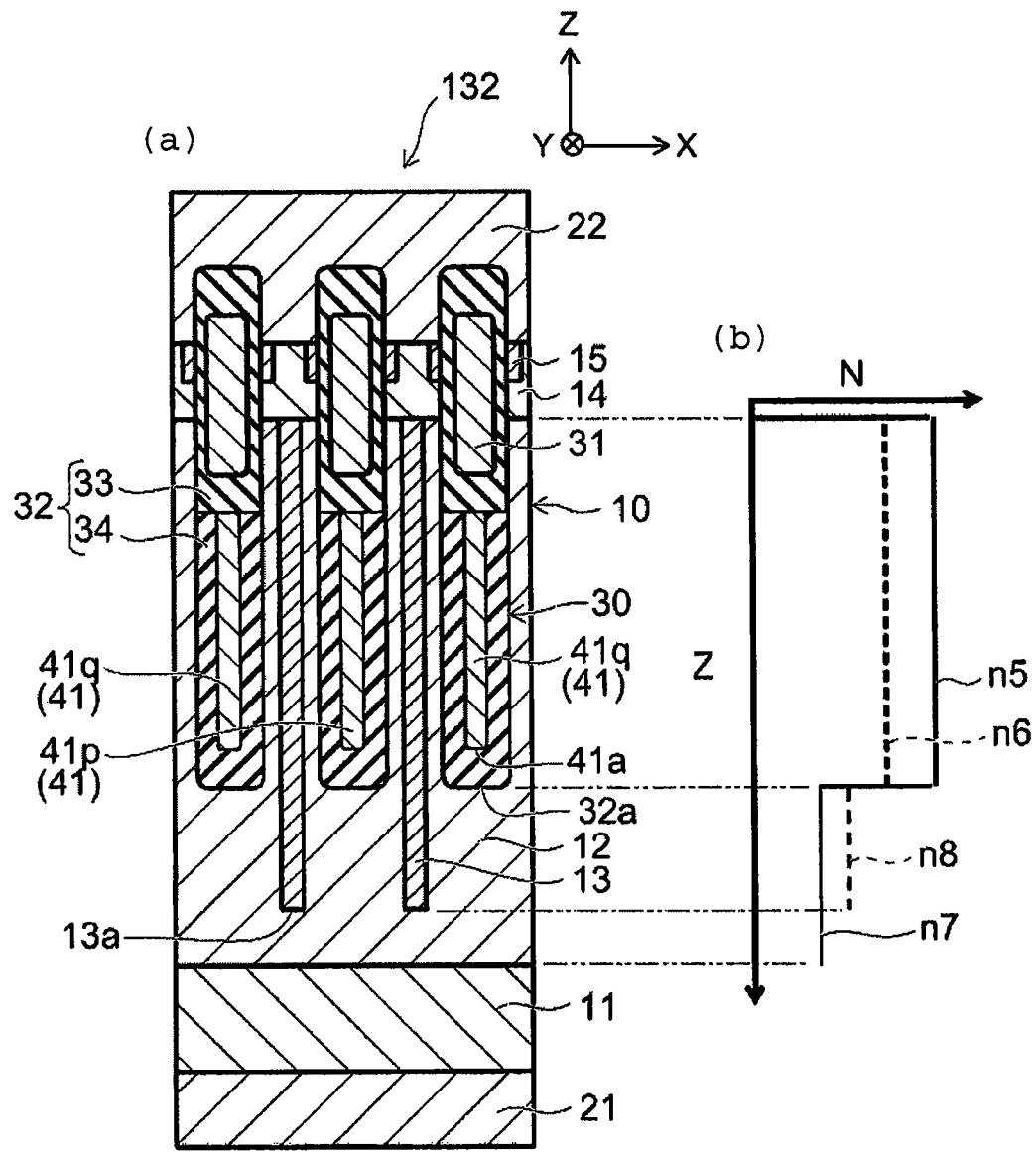

POWER SEMICONDUCTOR DEVICE

CROSS-REFERENCE TO RELATED APPLICATION

This application is a divisional of U.S. patent application Ser. No. 13/787,726, filed Mar. 6, 2013, which claims the benefit of priority from Japanese Patent Application No. 2012-200540, filed Sep. 12, 2012; the entire contents of both applications are incorporated herein by reference.

FIELD

Embodiments described herein relate to a power semiconductor device.

BACKGROUND

One type of semiconductor device is, for example, a vertical-type power MOSFET (Metal Oxide Semiconductor Field Effect Transistor). In the vertical-type power MOSFET, there is a super junction structure (hereinafter, referred to as an SJ structure), in which p-pillar layers and n-pillar layers are arranged alternately in the direction generally extending from the drain to the source of the SJ structure.

In general, low on-resistance can be achieved with the SJ structure. In the SJ structure, the pitch of the p-pillar layers and that of the n-pillar layers can be narrowed, by narrowing the width of each p-pillar layer and the width of each n-pillar layer. By narrowing the pitch of the layers, it is possible to further reduce the on-resistance. However, narrowing the n and p pillars of the SJ Structure will increase the capacitance between the drain and the source, resulting in gravity power loss in the off-state. In addition, reduction of the chip area in MOSFET is desired. However, if the chip area decreases, the input capacitance will decrease, and switching noise tends to occur.

DESCRIPTION OF THE DRAWINGS

FIG. 5A and FIG. 5B illustrate the schematic cross-sectional view of the configuration of another power semiconductor device according to the third embodiment.

DETAILED DESCRIPTION

Figure 1:
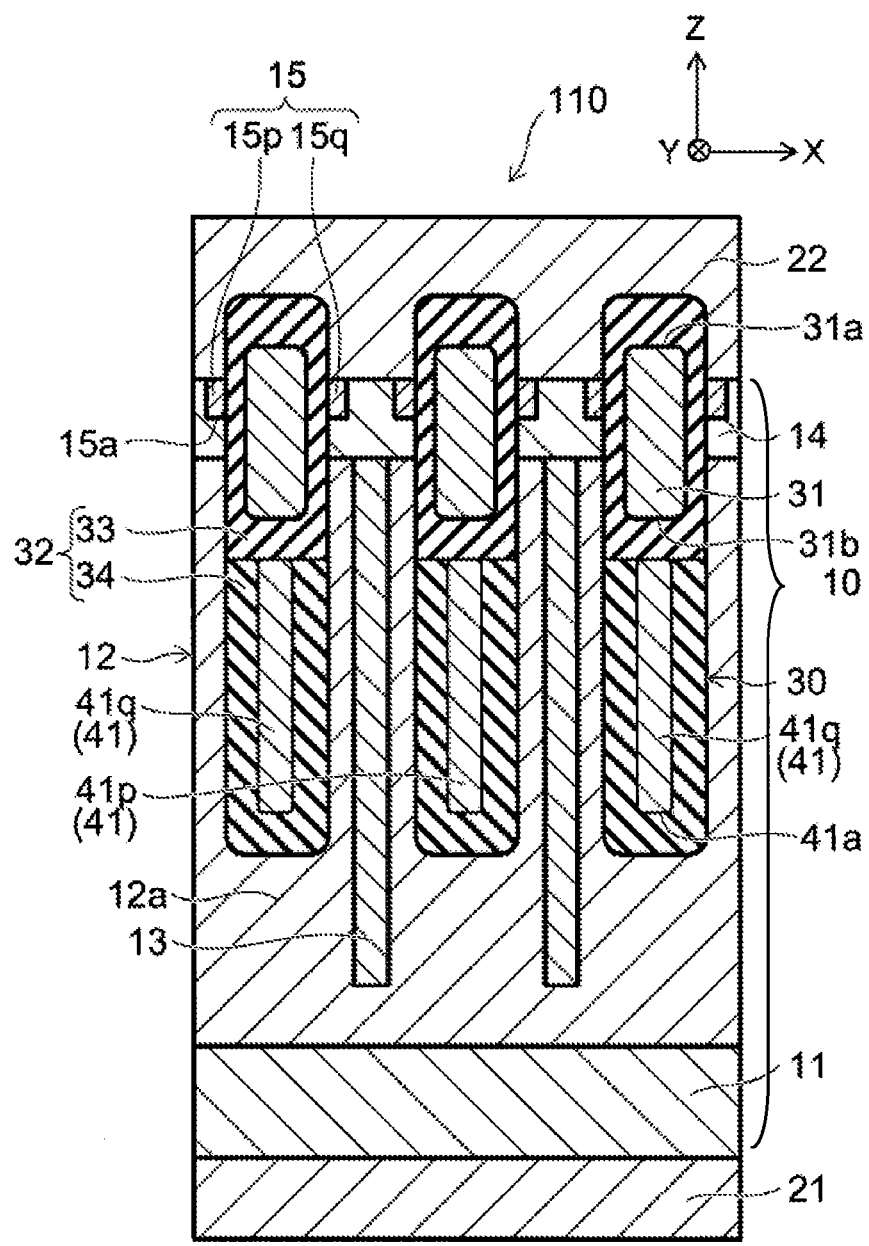
FIG. 1 illustrates the schematic cross-sectional view of the configuration of a power semiconductor device according to a first embodiment.

One or more embodiments of the present invention are directed to provide a power semiconductor device of low power loss, low noise, and low on-resistance.

One or more embodiments of the present invention will be explained with reference to the drawings as follows.

The drawings are schematic or conceptual, which means that the relationship between the thickness and the width of each portion as well as the proportion of the size between the parts is not necessarily the same with the actual ones. In addition, even when the same part is shown, it may be illustrated with different dimensions or proportions in the drawings.

In each drawing of the embodiments, the same notation will be given to those having the same element as previously described, and its detailed explanation will be omitted.

According to one or more embodiments of the present invention, a method for driving a power semiconductor device that has a source electrode, a drain electrode, a semiconductor layer formed between the source electrode and the drain electrode, a plurality of gate electrodes formed within the semiconductor layer, and a plurality of conductive layers that are formed between the gate electrodes and the drain electrode and in electrical communication with the gate electrodes. The method comprises providing a first electric potential to the source electrode, providing a second electric potential to the drain electrode, providing a third electric potential to the gate electrodes, providing a first electric potential to at least one of the conductive layers, and providing a third electric potential to at least another one of the conductive layers.

(First Embodiment)

FIG. 1 illustrates the schematic cross-sectional view of the configuration of a power semiconductor device according to the first embodiment.

As shown in FIG. 1, MOSFET 110 (power semiconductor device) comprises a laminate structure 10, drain electrode 21 (second electrode), source electrode 22 (third electrode), a plurality of gate electrodes 31 (only 3 shown), and a plurality of field plate electrodes 41 (first electrodes) (only 3 shown). MOSFET 110 is a MOSFET having a trench gate-type configuration.

The laminate structure 10 includes an n+ doped drain layer 11 (first semiconductor layer), a drift layer 12 (second semiconductor layer), a p-doped pillar layer 13 (third semiconductor layer), a p-doped base layer 14 (fourth semiconductor layer), and an n-doped source 15 (fifth semiconductor layer).

The $n^+$ drain layer 11 is an n-doped (a first conductive type). Alternatively the first conductive type may be a p-type, and in that case, the second conductive type will be an n-type.

The drift layer 12 is provided on the $n^+$ drain layer 11. The drift layer 12 is n-doped. However the concentration of the dopants of the drift layer 12 is lower than the concentration of the dopants of the $n^+$ drain layer 11. A plurality of p-pillar layers 13 are provided on the drift layer 12.

The p-pillar layers 13 are p-doped (the second conductive type). The p-pillar layers 13 are arranged at a predetermined interval along a first direction perpendicular to the surface of the drift layer 12, and generally extend inwardly thereof from the p-base layer 14 disposed on the surface of the drift layer 12. The portions of the drift layer 12 formed between the p-pillar layers 13 in the first direction constitute a plurality of n-pillar layers 12a. Further, the n-pillar layers 12a and the p-pillar layers 13 constitute the SJ structure. In this example, the p-pillar layer 13 do not extend through the drift layer 12 to contact the $n^+$ drain layer 11. However, the p-pillar layer 13 may be extended through the drift layer 12 contact the $n^+$ drain layer 11.

Herein, the long direction of the $n^+$ drain layer 11 and the drift layer 12. i.e., the Z-direction into the drift layer 12, will be considered a Z-axis direction. Further, a direction perpendicular to the Z-axis direction is determined to be an X-axis direction. The direction perpendicular to the Z-axis direction and the X-axis direction is determined to be a Y-axis direction.

In this example, the first direction is the X-axis direction. The first direction may be determined to be any direction that is perpendicular to the Z-axis direction, as shown in the upper right hand corner of FIG. 1.

The p-pillar layers extend in the Z-axis direction. In this example, the p-pillar layer 13 also extends in the Y-axis direction. The p-pillar layer 13 is in a shape of a thin layer or plate that extends along the Y-Z plane. In this example, the concentration of the n-doped dopants in the drift layer 12 is substantially constant in the Z-axis direction (depth direction). Furthermore, the concentration of the p-type dopants in the p-pillar layer 13 is substantially constant in the Z-axis direction. In addition, the concentration of the n-type dopants in the drift layer 12 is substantially the same as the concentration of the p-type dopants in the p-pillar layer 13.

A p-base layer 14 is provided over the upper surface of the drift layer 12. The p-base layer 14 is p-doped.

A plurality of n-source layers 15 are formed in the p-base layer 14. The n-source layers 15 are isolated from the n-doped drift layer 12. The n-source layers 15 are of n-doped. In this example, each n-source layer 15 extends in the Y-axis direction. A plurality of the n-source layers 15 are arranged in the X-axis direction. The plurality of n-source layers 15 are, for example, in a stripe form extending inwardly of the Fig. in the Y-direction. The n-source layers 15 may all be formed as a single layer provided entirely on the p-base layer 14.

For the n$^+$ drain layer 11, the drift layer 12, the p-pillar layer 13, the p-base layer 14, and the n-source 15, semiconductors such as silicon, compound semiconductors such as silicon carbide (SiC), gallium nitride (GaN), or wide band gap semiconductors such as diamond, for example, can be used.

The drain electrode 21 is formed below, in the Z-direction, the n$^+$ drain layer 11, and the drain electrode 21 is in contact with the n$^+$ drain layer 11. The drain electrode 21 is electrically connected to the n$^+$ drain layer 11. For the drain electrode 21, metal materials such as V, Ni, Au, Ag, or Sn, for example, can be used.

The source electrode 22 is formed over, in the Z-direction, the p-base layer 14, and is in electrical and physical contact with each of the individual n-source layers 15. For the source electrode 22, aluminum, for example, is used. In this example, as the source electrode 22 is electrically connected to the p-base layer 14 between the n source layers 15, a hole accumulated in the p-base layer 14 can directly flow to the source electrode 22, and therefore, the switching time of the MOSFET 110 from on to off can be shortened.

A plurality of gate electrodes 31 are provided on. And partially within, the laminate structure 10. Each gate electrode 31 is covered by an insulating film 32. The gate electrodes 31 are control electrodes. The gate electrodes 31 extend along the Z-axis inwardly of the laminate structure 11, and inwardly of the Fig. in the Y-axis direction. Thus, teach gate electrode 31 extends between n-source layers 15 that are formed on either sides of the gate electrode 31. The plurality of the gate electrodes 31 are arranged and spaced apart along the X-axis direction. The upper ends 31a of the gate electrodes 31 are located above the drift layer 12. In this example, the upper ends 31a of the gate electrodes 31 are located above the lower ends 15a of the n-source layers 15. The lower ends 31b of the gate electrodes 31 are located below the p-base layer 14 inwardly of the drift layer 12 where the drift layer 12 forms n-pillar layers 12a. In other words, the gate electrodes 31 extend through the p-base layer 14. For the gate electrode 31, polysilicon, for instance, is used.

A plurality of field plate electrodes 41 are formed in the laminate structure 10. Each of the field plate electrodes 41 are formed below, and aligned in the Z-direction with, each of the gate electrodes 31. Therefore, the plurality of field plate electrodes 41 are arranged along the X-axis direction with the gate electrodes 31. The lower ends 41a (in the Z-direction) of the field plate electrodes 41 terminated within the drift layer 12 and thus are spaced from the n$^+$ drain layer 11. Each field plate electrode 41 extends along the Y-axis direction as well as the Z-axis direction. For the field plate electrode 41, polysilicon, for instance, is used.

In this example, a portion of the gate electrodes 31 and whole portion of the field plate electrodes 41 are extended inwardly of the drift layer 12.

Insulating films 32 (33, 34) formed over, and in the X and Z directions encapsulate, the gate electrodes 31 and field plate electrodes 41. The insulating films 32 include a gate insulating films 33 and field plate insulating films 34. The gate insulating films 33 are formed between the gate electrodes 31 and the drift layer 12, between the gate electrodes 31 and the p-base layer 14, between the gate electrodes 31 and the n-source layers 15, and between the gate electrodes 31 and the source electrode 22. The gate insulating films 33 electrically insulate the drift layer 12, the p-base layer 14, the n-source layers 15, and the source electrode 22 from the gate electrodes 31. The gate insulating film 33 is further formed between the gate electrodes 31 and the field plate electrodes 41. Thus, the gate insulating films 33 physically separate the field plate electrodes 41 from the gate electrodes 31.

The field plate insulating film 34 is formed between the field plate electrodes 41 and the drift layer 12. The field plate insulating film 34 electrically insulates the drift layer 12 from the field plate electrodes 41. For the insulating films 32 (the gate insulating films 33 and the field plate insulating films 34), at least one of silicon oxide (for example, SiO$_2$), silicon nitride, and silicon oxynitride, for example, can be used.

The n-source layer 15 is comprised of a first part 15p and the second part 15q. Each gate electrode 31 is formed between the first part 15p and the second part 15q. The first part 15p and the second part 15q are in contact with the insulating film 32. The first part 15p and the second part 15q may be slightly separated or spaced in the X-direction from the insulating film 32. In the areas between two adjacent n-source layers 15, the source electrode 22 is in contact with the p-base layer 14 and is electrically connected to the p-base layer 14. The n-source layer 15 may be comprised of either the first part 15p or the second part 15q.

For example, the gate electrodes 31 and the field plate electrodes 41 are formed by the following method. First, a plurality of trenches 30 that extend inwardly of the drift layer along the Y-axis direction are formed. The trenches penetrate the n-source layer 15 and the p-base layer 14 and into the drift layer 12. Then, the insulating films 32 and the gate electrodes 31 and the field plate electrodes 41 are formed inside the trenches 30.

In this embodiment, at least one of the field plate electrodes 41 is electrically connected to the gate electrode 31. Then at least another one of the field plate electrodes 41 is electrically connected to the source electrode 22. For the rest of the description of this embodiment, the field plate electrode 41 electrically connected to the gate electrode 31 will be referred to as first field plate electrode 41p, and the field plate electrode 41 electrically connected to the source electrode 22 will be referred to as second field plate electrode 41q.

In this embodiment, a plurality of the first field plate electrodes 41p and a plurality of the second field plate electrodes 41q are formed, respectively. Further, the first field plate electrodes 41p and the second field plate electrodes 41q are arranged alternately in the X-axis direction.

Next, the operation of MOSFET 110 will be explained.

In the case of operation of MOSFET 110, for example, a positive voltage is applied to the drain electrodes 21, the source electrodes 22 are grounded, and the positive voltage is applied to the gate electrodes 31. In this way, current will flow between the drain electrode 21 and the source electrode 22. When applying a voltage to the gate electrodes 31, the drain electrodes 21, and the source electrodes 22, reverse channels are formed in the areas of the p-base layer 14 that are adjacent to the gate insulating films 33. The current passes through, for example, the n+ drain layer 11, the drift layer 12, the reverse channels formed in the p-based layer 14, and the n-source layer 15 from the drain electrodes 21 to the source electrode 22.

Next, the effect of the MOSFET 110 will be explained.

In the SJ configuration, by providing the field plate electrodes 41 inside the trenches 30, a depletion layer may easily formed in the X-axis direction from the field plate electrodes 41, by implantation or diffusion resulting in depleted n and p pillars 12a, 13 which will increase the junction capacitance (i.e., the drain-source capacitance) of the pn junction in the drift layer 12. If a voltage lower than the threshold voltage is applied to the gate electrode 31, the capacitor created between the drain and the source will be charged, even if the voltage difference is applied between the drain electrode 21 and the source electrode 22. The charge retained in the capacitor formed between the drain and the source will discharge, for example, if the application of voltage difference between the drain electrode 21 and the source electrode 22 is stopped. Thus, the capacitor between the drain and the source will be charged and discharged even if the switch operation is carried out without flowing current to the power semiconductor. That charging and discharging energy will be a loss of energy. Thus, when the power semiconductor device is used in application circuits such as a power source circuit or a motor drive circuit, etc., the power consumption of the application circuit (stand-by loss) increases.

In addition, narrowing reducing the size of the MOSFET is desired. However, if the device size, and thus the device features is reduced, the input capacitance (the sum of capacitance between gate-drain and capacitance between gate-source) decreases as well. If the input capacitance decreases, the time rate of change of the drain voltage (dV/dt) increases. If the dV/dt increases, though the switching time becomes shorter, switching noise more readily occurs.

If the field plate electrodes 41 are provided, the line of electric force from the drain electrodes 21 will also extend to the field plate electrodes 41. For this reason, if all of the field plate electrodes 41 are electrically connected to the source electrode 22, capacitance between the drain-source increases. If all of the field plate electrodes 41 are connected to the gate electrodes 31, the capacitance between the gate-drain, i.e., the feedback capacitance, increases. If the feedback capacitance increases, for instance, during the switching from an on-state to an off-state (at the time of turning off), the turn off time will become longer with the increase in the amount of discharge of the feedback capacitance. The longer turn off time results in the increase of power consumption (loss) at the time of turning off. In this way, the increase of capacitance between the gate and the drain increases power consumption (switching loss) occurred during switching between the off-state and on-state.

On the other hand, in the MOSFET 110 according to this embodiment, at least one of the field plate electrodes 41 (the first field plate electrode 41p) is electrically connected to the gate electrode 31, and at least one of the other field plate electrodes 41 (the second field plate electrode 41q) is electrically connected to the source electrodes 22. In this way, the increase in the capacitance between the drain-source and between the gate-drain can be suppressed. Furthermore, if the first field plate electrode 41p and the second field plate electrode 41q are adjacent to each other, the capacitance between the gate-source can increase. That is to say, the input capacitance can become larger. Because of this, even if the device size is reduced in the MOSFET 110, switching noise may be suppressed. Therefore, in the MOSFET 110, stand-by loss and switching loss can be reduced, and switching noise can also be prevented. Then, even if the pitch of the periodic structure of SJ structure is reduced, low on-resistance can be obtained while adverse effects on loss and noise can be suppressed. In the MOSFET 110 according to this embodiment, a power semiconductor device with low loss, low noise, and low on-resistance can be obtained.

Next, another example of the first embodiment will be explained.

Figure 2:
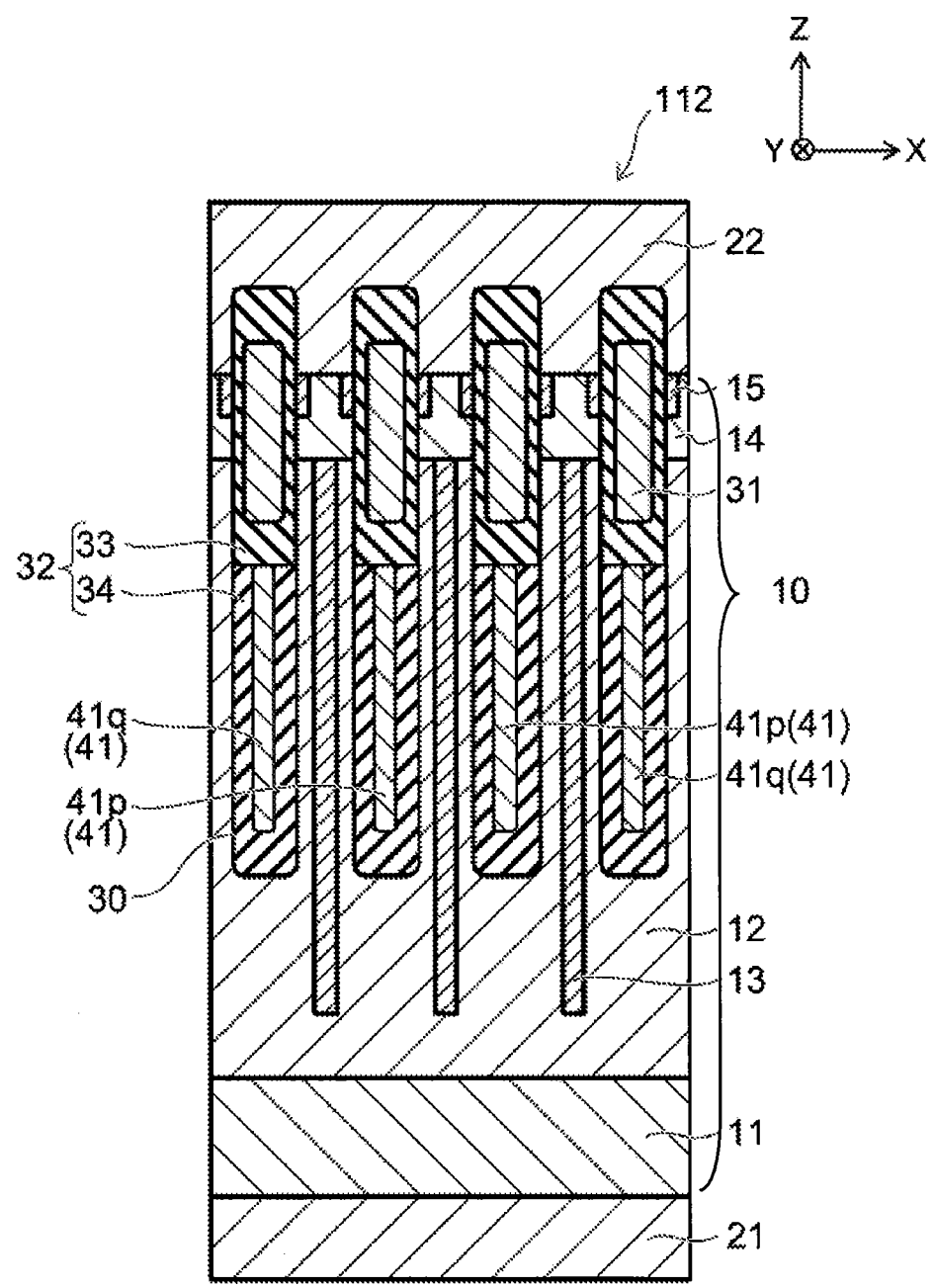
FIG. 2 illustrates the schematic cross-sectional view of the configuration of another power semiconductor device according to the first embodiment.

FIG. 2 is the schematic cross-sectional view illustrating the configuration of another separate power semiconductor device according to the first embodiment.

As shown in FIG. 2, two (a pair of) of the first field plate electrodes 41p are arranged side by side and are interposed between two second field plate electrodes 41q in the MOSFET 112 according to this embodiment. A power semiconductor device with low loss, low noise, and low on-resistance can be obtained even in the MOSFET 112.

Furthermore, for example, two first field plate electrodes 41p and two second field plate electrodes 41q may be arranged alternately, i.e., alternate groupings of two adjacent field plate electrodes 41p and two adjacent field plate electrodes 41q extend in the X-direction over the width of the super junction. In this way, an arrangement of the first field plate electrodes 41p and the second field plate electrodes 41q is established when pairs of field plate electrodes 41p are disposed between field plate electrodes 41q, and pairs of field plate electrodes 41q are disposed between field plate electrodes 41p. If at least one of the first field plate electrodes 41p and at least one of the second field plate electrodes 41q are adjacent to each other, the loss can be minimized and the noise can be suppressed. Like in the MOSFET 110, if the first field plate electrodes 41p and the second field plate electrodes 41q are arranged alternately in groupings, the loss can be further reduced and the switching noise can also be further decreased.

(Second Embodiment)

Next, a second embodiment will be explained.

Figure 3:
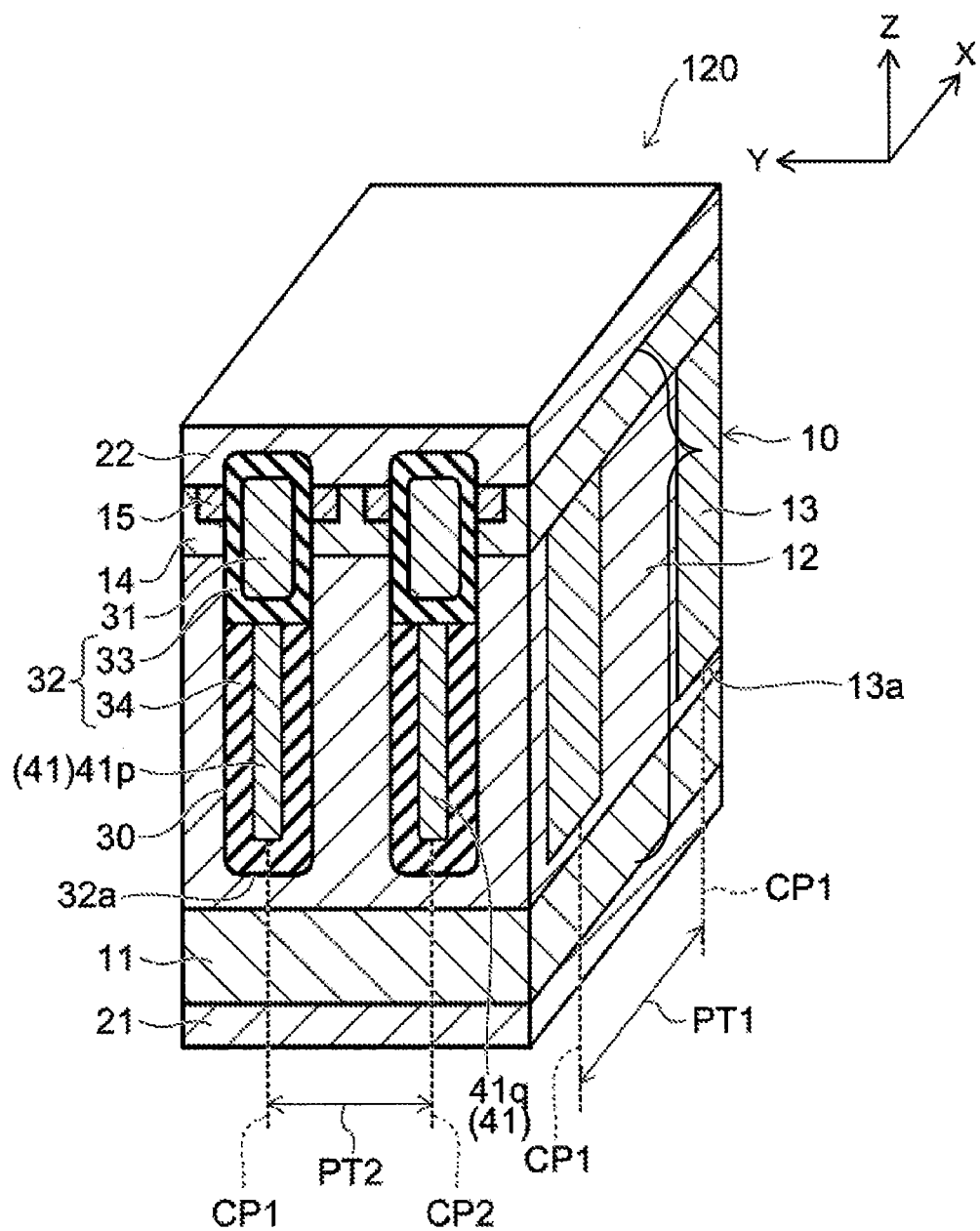
FIG. 3 illustrates the schematic cross-sectional perspective view of the configuration of a power semiconductor device according to a second embodiment.

FIG. 3 is a schematic cross-sectional perspective view illustrating a configuration of a power semiconductor device according to the second embodiment.

As shown in FIG. 3, in MOSFET 120, the p-pillar layers 13 are arranged at a predetermined interval along the first direction (X-axis direction, and extend inwardly of the drift layer 12 in the Z-direction In this embodiment, the width of n-source layers 15 shown in section are arranged along the Y-axis direction, and they extend along the X-axis direction on either side of the gate electrodes 31. The gate electrodes 31 are arranged along the Y-axis direction, and the field plate electrodes 41 are shown in section across the width of the Y-axis direction. Each gate electrode 31 and each field plate electrode 41 extends inwardly of the Fig. in the X-axis direction. The lower ends 13a of the p-pillar layers 13 are inwardly of the drift than do the trenches within which the field plate electrodes 41p,q are formed and thus the pillar layers terminate below the lower ends 32a (lower ends of the trenches 30) of the insulating films 32. The depth of the trenches and p-pillar layers may alternatively be configured in the same manner as the first embodiment, so explanation thereof will be omitted.

In MOSFET 120, the X-direction to which the n-source layer 15, the gate electrode 31, and the field plate electrode 41 extend intersects (for example, is orthogonal to) with the Z-direction in which the p-pillar layers 13 extend. The trenches 30 are formed after the drift layer 12 is formed. A portion of the p-pillar layers 13 that intersect with the field plate and gate electrodes is removed by the trenches 30. If the depth of the trenches 30 in the Z-axis direction is longer than the depth of the p-pillar layers 13 in the Z-axis direction, each p-pillar layer 13 is sectioned or divided by the trenches 30.

The center of each p-pillar layer 13 in the X-axis direction will be referred to as center location CP1. The length between the center locations CP1 of two adjacent p-pillar layers 13 in the X-axis direction will be referred to as pitch PT1. The center of each field plate electrode 41 will be referred to as center location CP2. The length between the center locations CP2 of two adjacent field plate electrodes 41 in the Y-axis direction will be referred to as pitch PT2. The pitch PT1 is wider than the pitch PT2 in the MOSFET 120.

In the MOSFET 120, the n-source layers 15, the gate electrodes 31, the trenches 30, and the field plate electrodes 41 intersect the p-pillar layers 13. Thus, lowering of the breakdown voltage due to process variations can be suppressed.

In the MOSFET 110 (FIG. 1), there is a possibility of variations in the width of the n-pillar layer 12a between two adjacent trenches 30, and variations in the width of the trenches 30. If there is a variation in the widths of the n-pillar layers 12a between the trenches 30, there is a possibility of variation in the quantity of the dopants of adjacent n-pillar layers 12a. The SJ Structure can obtain high breakdown voltage if the quantity (the amount of the dopants) of the n-type dopants in the n-pillar layers 12a is substantially the same as the quantity of the p-type dopants in the p-pillar layers 13. Thus, variation in the quantity of the dopants of the n-pillar layer 12 will lose the balance of the concentrations of the dopants, resulting in decreasing the breakdown voltage.

In the MOSFET 120, the p-pillar layers 13 and the trenches 30 intersect with each other. Because of this, even if there is variation in the widths of the trenches 30 in the MOSFET 120, variation in the widths of the n-pillar layers 12a and the p-pillar layers 13 can be suppressed. Thus, in the MOSFET 120, compared to the MOSFET 110, a higher breakdown voltage can be obtained.

In addition, it is possible to independently set the pitch of the p-pillar layers 13 (pitch PT1) and the pitch of the field plate electrodes 41 (pitch PT2) because the p-pillar layers 13 and the trenches 30 are arranged along different directions. For example, in the MOSFET 120, the pitch PT1 is wider than the pitch PT2. In the MOSFET 120, the depletion layer easily elongates in the Y-axis direction due to the field plate electrodes 41. Thus, even without the miniaturization of the SJ Structure, the concentration of the dopants of the n-pillar layers 12a and the p-pillar layers 13 can be increased. Thus, in the MOSFET 120, the on-resistance can be further reduced, compared to the MOSFET 110.

(Third Embodiment)

Next, the third embodiment will be explained.

Figures 4A, 4B:
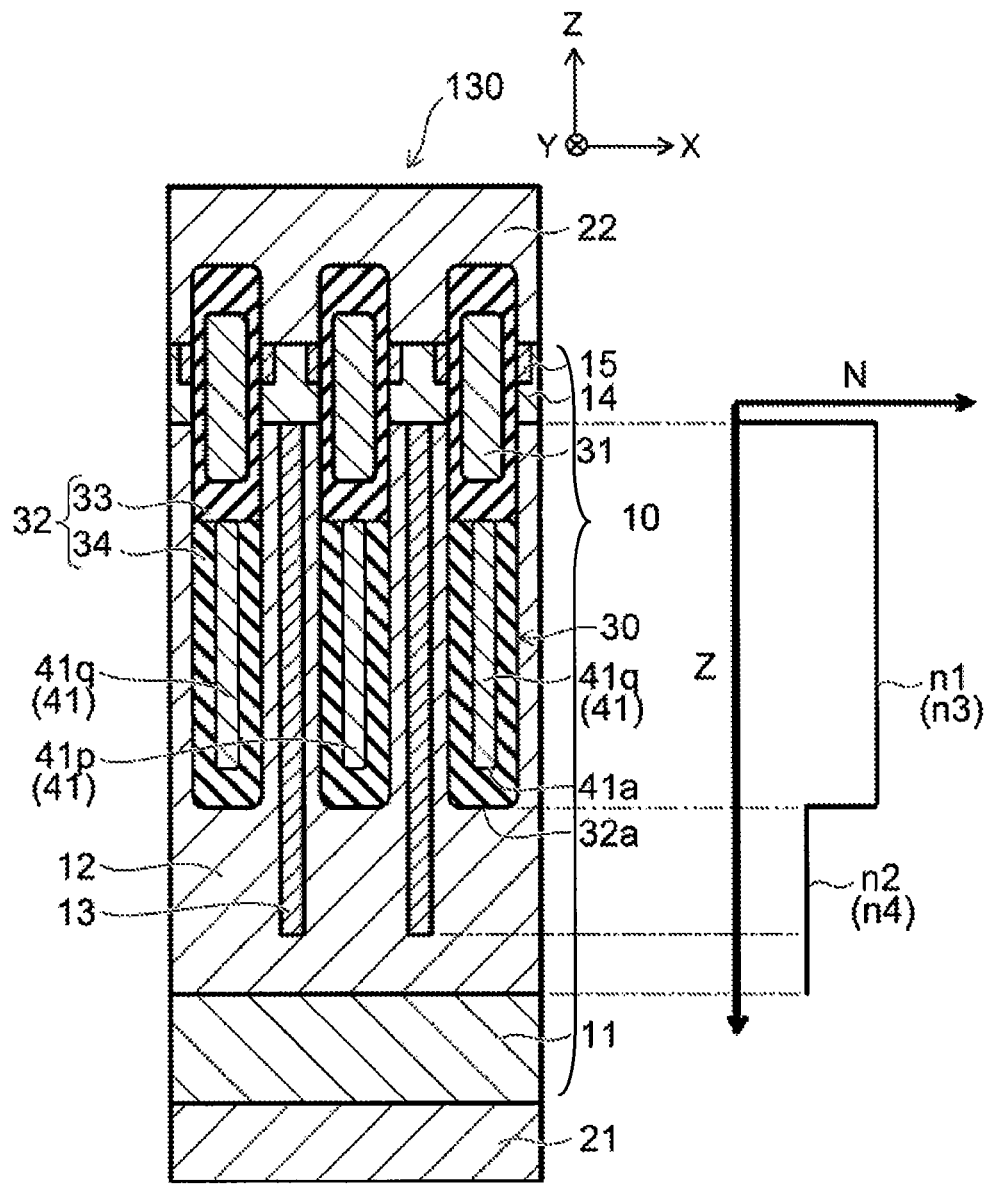
FIG. 4A and FIG. 4B illustrate the schematic cross-sectional view of the configuration of a power semiconductor device according to a third embodiment.

FIG. 4A and FIG. 4B illustrate schematic diagrams of a power semiconductor device according to the third embodiment.

FIG. 4A is the schematic cross-sectional view of MOSFET 130. FIG. 4B shows the graph illustrating the concentration profile of the n-type dopants in the drift layer 12 and the concentration profile of the p-type dopants in the p-pillar layers 13. The horizontal axis in FIG. 4B is the concentration N of the dopants. The vertical axis is the location Z in the Z-axis direction. Then, as the concentration of the n-type dopants is equal to the concentration of the p-type dopants, and both are described by the same line.

In the MOSFET 130, as shown in FIG. 4A, the arrangements of the laminate structure 10, the drain electrode 21, the source electrode 22, the gate electrodes 31, and the field plate electrodes 41 are similar to those in the MOSFET 110. In the MOSFET 130, the concentration profiles of the dopants in the drift layer 12 and the p-pillar layers 13 of the laminate structure 10 are different than those in the MOSFET 110. The concentration profiles of the dopants will be explained below.

As shown in FIG. 4B, the concentration n1 of n-type dopants at the portion above the lower ends 41a of the field plate electrodes 41 in the drift layer 12 is higher than the concentration n2 of n-type dopants at the portion below the lower ends 41a of the field plate electrodes 41 in the drift layer 12. In addition, the concentration n3 of p-type dopants at the portion above the lower ends 41a of the field plate electrodes 41 in the p-pillar layers 13 is higher than the concentration n4 of p-type dopants at the portion below the lower ends 41a of the field plate electrodes 41 in the p-pillar layers 13.

In this example, the concentration n1 is the concentration of the dopants at the portion above the lower ends 32a of the insulating films 32 of the drift layer 12. The concentration n2 is the concentration of the dopants at the portion below the lower ends 32a of the insulating films 32 of the drift layer 12. The concentration n3 is the concentration of the dopants of the p-pillar layers 13 at the portion thereof above the lower ends 32a of the insulating layers 32. The concentration n4 is the concentration of the dopants at the portion of the p-pillar layers 13 below the lower ends 32a of the insulating films 32.

By forming the field plate electrodes 41, the depletion layer may be extended from not only the pn junction of the SJ Structure but also from the field plate electrodes 41. Thus, it is possible to further decrease the on-resistance by increasing the concentration of the dopants of the drift layer 12 (n-pillar layer 12a) and the p-pillar layers 13 at the portion above the lower ends 41a.

Next, another example of the third embodiment will be explained as follows.

FIG. 5A and FIG. 5B are schematic illustrations of another configuration of the power semiconductor device according to the third embodiment.

FIG. 5A is the schematic cross-sectional view of MOSFET 132. FIG. 5B is a graph illustrating the concentration of the n-type dopants in the drift layer 12 and the concentration of the p-type dopants in the p-pillar layers 13. The horizontal axis of FIG. 5B is the concentration N of the dopants. The vertical axis is the location Z in the Z-axis direction. The solid line in FIG. 5B shows the concentration of the n-type dopants in the drift layer 12, and the dashed line shows the concentration of the p-type dopants in the p-pillar layers 13.

As shown in FIG. 5A, the arrangements of the laminate 10, the drain electrodes 21, the source electrodes 22, the gate electrodes 31, and the field plate electrodes 41 in MOSFET 132 are similar as those in the MOSFET 110. The concentration profiles of the dopants in the MOSFET 132 will be given explained as follows.

As shown in FIG. 5B, the concentration n5 of the n-type dopants at the portion of the drift layer 12 above the lower ends 41a of the field plate electrodes 41 is higher than the concentration n6 of the p-type dopants at the portion of the p-pillar layers 13 above the lower ends 41a of the field plate electrodes 41. In this example, the concentration n5 is the concentration of the n-type dopants at the portion of the drift layer 12 above the lower ends 32a of the insulating films 32.

The concentration n6 is the concentration of the p-type dopants at the portion of the p-pillar layers 13 above the lower ends 32a of the insulating films 32.

The field plate electrodes 41 serve a similar function as that of the p-pillar layers 13. Thus, as described above, the concentration of the dopants in the drift layer 12 is high at the portion in which the field plate electrode 41 is provided. Thus, the concentration of the local electric field can be further suppressed in the drift layer 12. Therefore, the effect of maintaining the breakdown voltage can improve in the MOSFET 132.

In addition, in the MOSFET 132, the concentration n7 of the n-type dopants at the portion below the lower ends 41a of the field plate electrodes 41 in the drift layer 12 is lower than the concentration n8 of the p-type dopants at the portion below the lower ends 41a of the field plate electrodes 41 in the p-pillar layers 13. In this example, the concentration n7 is the concentration of the n-type dopants of at the portion below the lower ends 32a of the insulating film 32 in the drift layer 12. The concentration n8 is the concentration of the p-type dopants at the portion below the lower ends 32a of the insulating films 32 in the p-pillar layers 13.

By setting the concentrations of the dopants in the drift layer 12 and the p-pillar layer 13 as described above, the area between the lower ends 32a of the insulating films 32 and the lower end s13a of the p-pillar layers 13 in the drift layer 12 will substantially become a p-layer. Also, the electric field becomes high in the portion of pn junction. Thus, it is possible to locate the area with high electric field at the bottom portion of the p-pillar layers 13 and lower the electric field at the field plate insulating films 34. Therefore, high reliability and high avalanche resistance can be achieved.

In the embodiments indicated above, the MOSFET having a trench gate-type structure is used for the power semiconductor device of the present invention. The power semiconductor device of the present invention may also be, for example, a MOSFET having a planar gate structure. In addition, the power semiconductor device, for example, may be an IGBT (Insulated-Gate Bipolar Transistor), etc. If the power semiconductor device is the IGBT, for example, a collector electrode acts as the second electrode, an emitter electrode act as the third electrode, the p-collector layer of the second conductivity type acts as the first semiconductor layer, and an n-emitter layer acts as the fifth semiconductor layer. Furthermore, one or more embodiments indicated above described the SJ structure with a stripe shape in which the n-pillar layers 12a and the p-pillar layers 13 are alternatively arranged. The SJ structure may be, for example, a mesh form in which the n-pillar layers 12a intersect with the p-pillar layers 13 or a checkered pattern form in which the n-pillar layers 12a and the p-pillar layers 13 are arranged in the checkered pattern.

According to one or more embodiments, a power semiconductor device with low loss, low noise, and low on-resistance is obtained.

In the embodiments, "perpendicular" and "parallel" not only represent a true vertical relationship and a true parallel relationship, but it can also include, for example, a relationship that have deviations from the true vertical and true parallel relationships due to the manufacturing process; it may be substantially vertical or substantially parallel.

The embodiments have been explained referring to concrete examples. However, the embodiments are not limited to those specific examples. For example, with regard to the specific configuration of the elements, such as the first semiconductor layer, the second semiconductor layer, the third semiconductor layer, the fourth semiconductor layer, the fifth semiconductor layer, the laminate, the gate electrode, the first electrode, the second electrode, and the third electrode, the person skilled in the art can carry out the embodiments by appropriately selecting the ranges of each element. As long as the same effect can be achieved, it falls within the scope of this disclosure.

In addition, two or more elements in the above-explained examples can be combined to the extent that it is technically possible. The combinations also belong to the scope of the present disclosure as long as the gist of the present disclosure is observed.

Based on the power semiconductor device described above as the embodiment of the present disclosure, all power semiconductor devices obtained by the person skilled in the art by carrying out an appropriate design modification also belong to the scope of the present disclosure as long as the gist of the present disclosure is observed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for driving a semiconductor device that has a source electrode, a drain electrode, a semiconductor layer between the source electrode and the drain electrode, a plurality of gate electrodes within the semiconductor layer, and a plurality of conductive layers that are between the gate electrodes and the drain electrode, the method comprising:
   providing a first electric potential to the source electrode;
   providing a second electric potential to the drain electrode;
   providing a third electric potential to the gate electrodes;
   providing the first electric potential to at least one conductive layer of the plurality of conductive layers; and
   providing the third electric potential to at least another one of the plurality of conductive layers.

2. The method according to claim 1, wherein
   the at least one conductive layer to which the first electric potential is provided and the conductive layers to which the third electric potential is provided are arranged alternately.

3. The method according to claim 2, wherein
   the conductive layers extend in a direction that is substantially perpendicular to a plane of the drain electrode.

4. The method according to claim 1, wherein
   the at least one conductive layer to which the first electric potential is provided adjoins the conductive layers to which the third electric potential is provided.

5. The method according to claim 1, wherein
   the at least one conductive layer to which the first electric potential is provided is arranged between the conductive layers to which the third electric potential is provided.

6. The method according to claim 1, wherein
   the conductive layers to which the third electric potential is provided adjoins and is surrounded by the at least one conductive layer to which the first electric potential is provided.

7. A method for driving a semiconductor device that has a source electrode, a drain electrode, a semiconductor layer between the source electrode and the drain electrode, a plurality of gate electrodes within the semiconductor layer, and a plurality of conductive layers that are between the gate electrodes and the drain electrode, the method comprising:
> providing a first electric potential to the source electrode;
> providing a second electric potential to the drain electrode;
> providing a third electric potential to the gate electrodes;
> providing the first electric potential to a first conductive layer of the plurality of conductive layers; and
> providing the third electric potential to a second conductive layer and a third conductive layer of the plurality of conductive layers.

8. The method according to claim 7, wherein
> the first conductive layer is layered alternatively with and the second and third conductive layers.

9. The method according to claim 8, wherein
> the first, the second, and the third conductive layers extend in a direction that is substantially perpendicular to a plane of the drain electrode.

10. The method according to claim 7, wherein
> the first conductive layer adjoins the second and third conductive layers.

11. The method according to claim 7, wherein
> the first conductive layer is arranged between the second and third conductive layers.

12. The method according to claim 7, wherein
> the second and third conductive layers adjoin and are positioned on opposing sides of the first conductive layer.

* * * * *